(12) United States Patent
Kobayashi

(10) Patent No.: US 11,557,980 B2
(45) Date of Patent: Jan. 17, 2023

(54) POWER CONVERSION APPARATUS

(71) Applicant: DENSO CORPORATION, Kariya (JP)

(72) Inventor: Masayoshi Kobayashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/163,677

(22) Filed: Feb. 1, 2021

(65) Prior Publication Data

US 2021/0159806 A1 May 27, 2021

Related U.S. Application Data

(63) Continuation of application No. PCT/JP2019/025763, filed on Jun. 28, 2019.

(30) Foreign Application Priority Data

Jul. 31, 2018 (JP) .............................. JP2018-144061

(51) Int. Cl.
*H02B 1/20* (2006.01)
*H02M 7/00* (2006.01)
*H02M 1/00* (2006.01)
*H02G 5/00* (2006.01)
*H02B 11/06* (2006.01)

(52) U.S. Cl.
CPC .............. *H02M 7/003* (2013.01); *H02M 1/00* (2013.01); *H02B 11/06* (2013.01); *H02G 5/00* (2013.01)

(58) Field of Classification Search
CPC .......... H02M 7/003; H02M 1/00; H02G 5/00; H02B 11/06; H02B 1/20
See application file for complete search history.

(56) References Cited

U.S. PATENT DOCUMENTS 9,461,451 B2 * 10/2016 Sawada .................... H02G 5/02

FOREIGN PATENT DOCUMENTS

| JP | 2008-253055 A | 10/2008 |
| JP | 2011-109767 A | 6/2011 |
| JP | 2018-042311 A | 3/2018 |

OTHER PUBLICATIONS

Jul. 30, 2019 International Search Report issued in International Patent Application No. PCT/JP2019/025763.

* cited by examiner

*Primary Examiner* — Gary L Laxton
(74) *Attorney, Agent, or Firm* — Oliff PLC

(57) ABSTRACT

A power conversion apparatus includes: a semiconductor module including a built-in switching element; and a pair of bus bars connected to a power terminal of the semiconductor module. The pair of bus bars has body plate parts that are arranged so as to at least partially face each other in a thickness direction, and pluralities of terminal connection parts that are branched from the body plate parts and to which the power terminal is connected. At least one of the pair of bus bars has a plurality of annular parts that are annularly formed so as to include the plurality of terminal connection parts.

8 Claims, 12 Drawing Sheets

POWER CONVERSION APPARATUS

CROSS-REFERENCE TO RELATED APPLICATION

The present application is a continuation application of International Application No. PCT/JP2019/025763, filed Jun. 28, 2019, which claims priority to Japanese Patent Application No. 2018-144061, filed Jul. 31, 2018. The contents of these applications are incorporated herein by reference in their entirety.

BACKGROUND

1. Technical Field

The present disclosure relates to a power conversion apparatus.

2. Related Art

Some power conversion apparatuses such as inverters mounted in hybrid automobiles or electric automobiles include semiconductor modules with built-in switching elements and a plurality of bus bars connected to the power terminals of the semiconductor modules. These bus bars are connected to a capacitor or the like, for example, so that electric power is input to the semiconductor modules via the bus bars.

SUMMARY

The present disclosure provides a power conversion apparatus. As an aspect of the present disclosure, a power conversion apparatus includes a semiconductor module including a built-in switching element and a pair of bus bars connected to a power terminal of the semiconductor module. The pair of bus bars has body plate parts that are arranged so as to at least partially face each other in a thickness direction and pluralities of terminal connection parts that are branched from the body plate parts and to which the power terminal is connected. At least one of the pair of bus bars has a plurality of annular parts that are annularly formed so as to include the plurality of terminal connection parts.

DETAILED DESCRIPTION OF THE PREFERRED EMBODIMENTS

In recent years, power conversion apparatuses have been expected to have higher switching speeds and to handle greater amounts of current along with demands for size reduction and higher output. Thus, reduction in the inductance of the bus bars is further sought.

For example, in the power conversion apparatus disclosed in JP 2011-109767A, the power terminals are connected to connection terminals provided at ends of the bus bars. Thus, electric current paths are likely to be restricted around the connection terminals, which makes it difficult to reduce the inductance.

The present disclosure is intended to provide a power conversion apparatus that is capable of reducing the inductance.

An aspect of the present disclosure is in a power conversion apparatus including: a semiconductor module including a built-in switching element; and a pair of bus bars connected to a power terminal of the semiconductor module, wherein the pair of bus bars has: body plate parts that are arranged so as to at least partially face each other in a thickness direction; and pluralities of terminal connection parts that are branched from the body plate parts and to which the power terminal is connected, and at least one of the pair of bus bars has a plurality of annular parts that are annularly formed so as to include the plurality of terminal connection parts.

In the power conversion apparatus, at least one of the pair of bus bars has the plurality of annular parts that are annularly formed so as to include the plurality of terminal connection parts. This increases electric current paths around the terminal connection parts, thereby to reduce the inductance of the bus bars.

As described above, according to the above-described aspect, it is possible to provide a power conversion apparatus that is capable of reducing the inductance.

The foregoing and other objects, features, and advantages of the present disclosure will be more clarified by the following detailed descriptions with reference to the accompanying drawings.

First Embodiment

An embodiment of a power conversion apparatus will be described with reference to FIGS. 1 to 11.

Figure 1:
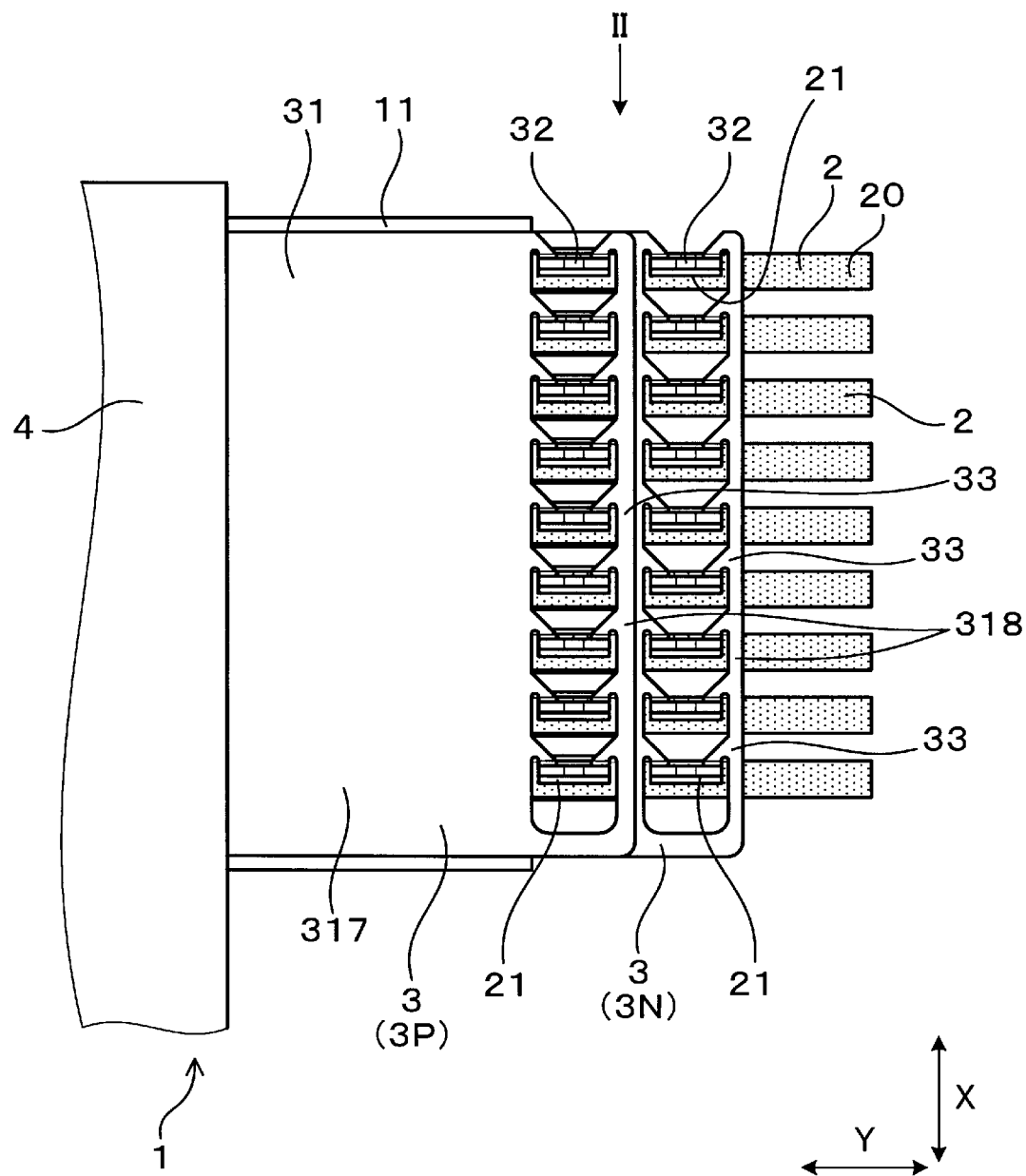
FIG. 1 is an explanatory plan view of a power conversion apparatus in a first embodiment.
Figure 2:
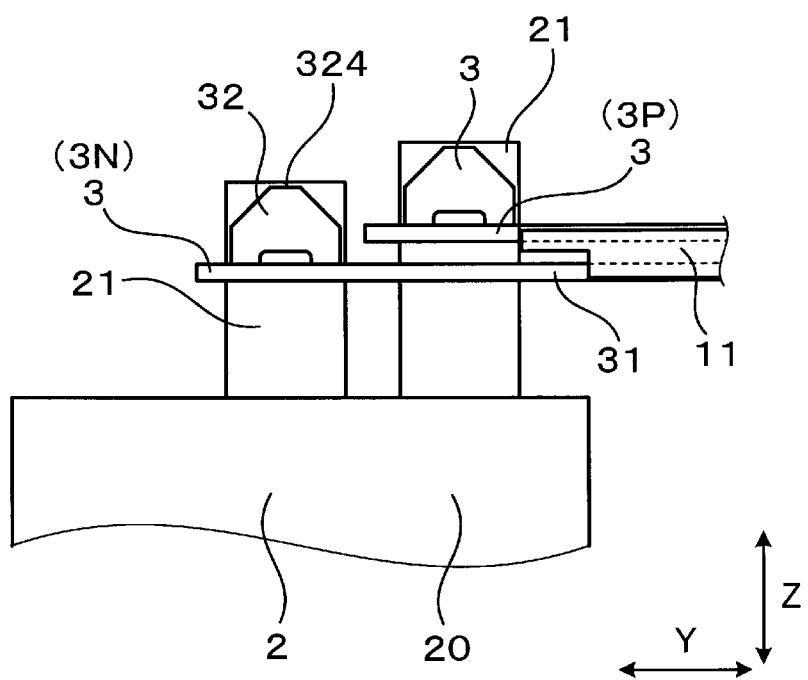
FIG. 2 is a front view of connections between terminal connection parts and power terminals as viewed from the direction of arrow II in FIG. 1.

A power conversion apparatus 1 of the present embodiment has semiconductor modules 2 and a pair of bus bars 3 as shown in FIGS. 1 and 2. The semiconductor modules 2 each have a switching element built therein. The pair of bus bars 3 is connected to power terminals 21 of the semiconductor modules 2.

As shown in FIGS. 3 to 6, the pair of bus bars 3 has body plate parts 31 and pluralities of terminal connection parts 32. The body plate parts 31 of the pair of bus bars 3 are arranged so as to partially face each other in a thickness direction Z. The pluralities of terminal connection parts 32 are branched from the body plate parts 31. As shown in FIGS. 1 and 2, the power terminals 21 are connected to the terminal connection parts 32.

Figure 7:
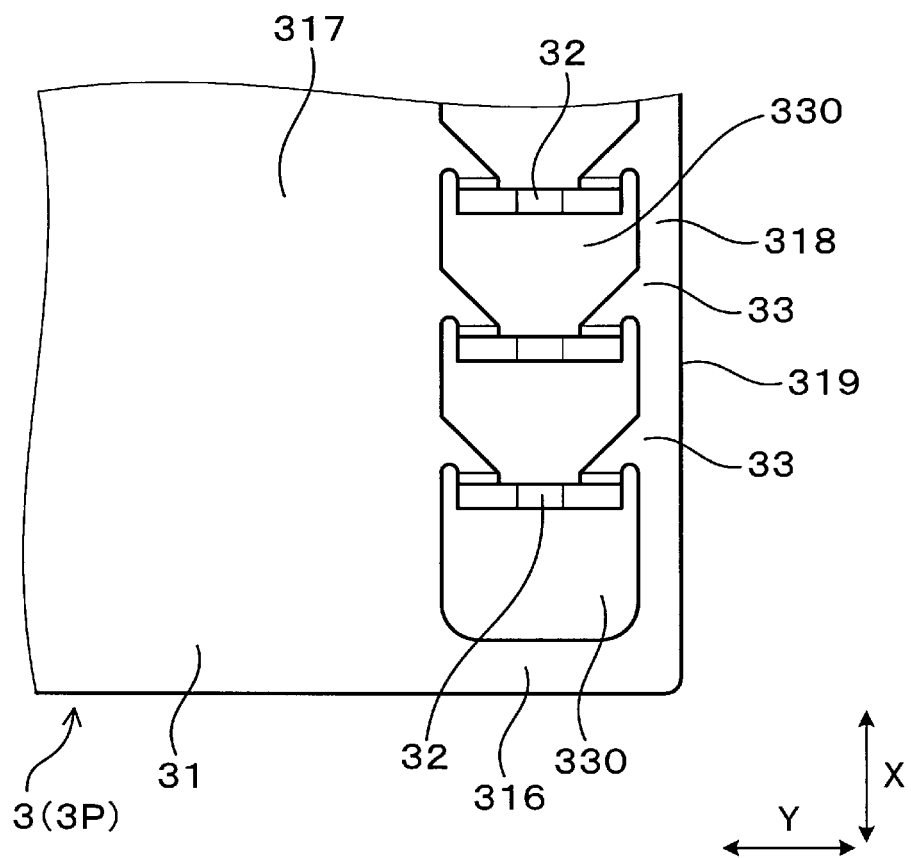
FIG. 7 is an explanatory plan view of a portion of a positive bus bar in the first embodiment.
Figure 8:
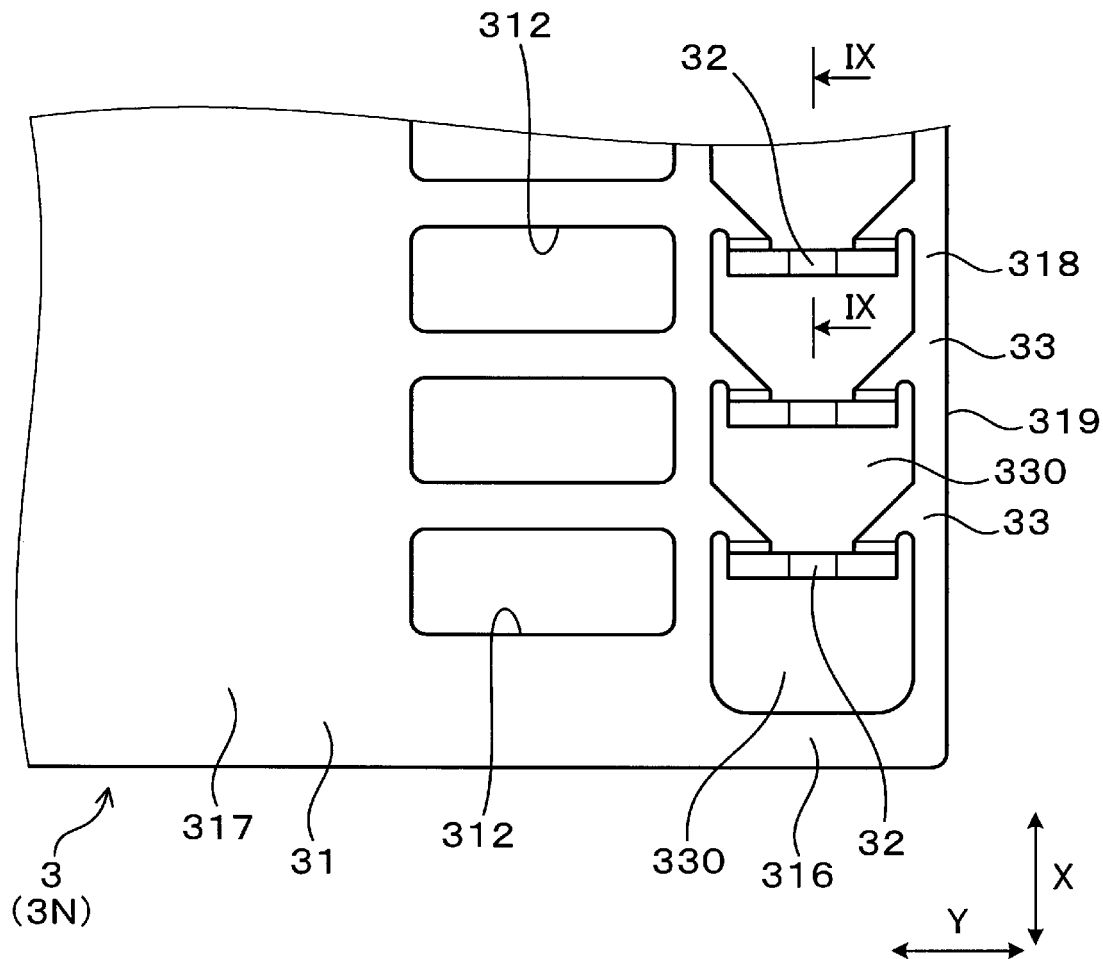
FIG. 8 is an explanatory plan view of a portion of a negative bus bar in the first embodiment.

As shown in FIGS. 3 to 6, at least one of the pair of bus bars 3 has a plurality of annular parts 33 that are annularly formed to include the plurality of terminal connection parts 32. In the present embodiment, as shown in FIGS. 7 and 8, each of the pair of bus bars 3 both has the plurality of annular parts 33.

Figure 6:
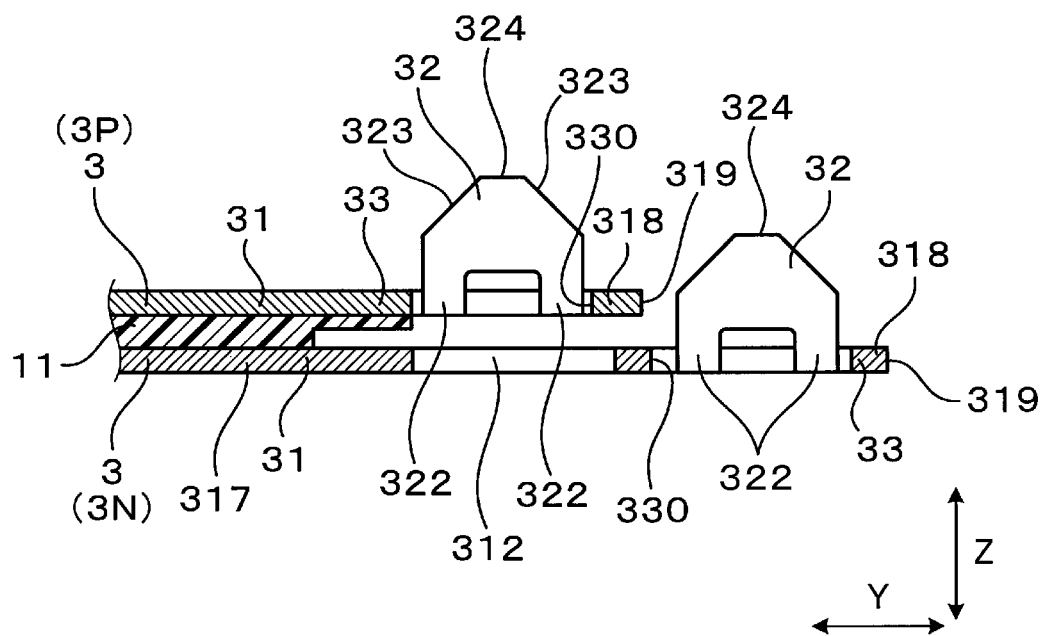
FIG. 6 is a cross-sectional view of the pair of bus bars, taken along line VI-VI in FIG. 4.

As shown in FIG. 6, the terminal connection parts 32 protrude in the thickness direction Z with respect to the body plate parts 31. In the following description, the thickness direction Z of the body plate parts 31 will also be called simply Z direction.

Figure 9:
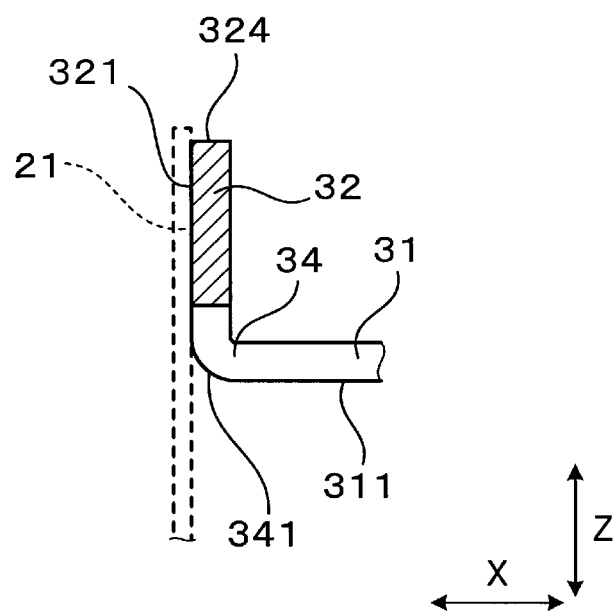
FIG. 9 is a cross-sectional view of a terminal connection part, taken along line IX-IX in FIG. 8.

As shown in FIG. 9, the terminal connection parts 32 each have a curved part 341 that connects a main surface 311 of the body plate part 31 and a terminal arrangement surface 321 of the terminal connection part 32, on the outer surface of a rising bent part 34 between the terminal connection part 32 and the body plate part 31. A leading end of the power terminal 21 and a leading end of the terminal connection part 32 are oriented in the same direction. The curved part 341 is formed with a curvature radius equal to or greater than the plate thickness of the bus bars 3, for example.

In the present embodiment, the leading end of the power terminal 21 and the leading end of the terminal connection part 32 are oriented to the same direction in the Z direction. The terminal connection parts 32 of the pair of bus bars 3 are oriented to the same direction in the Z direction. For the sake of convenience, the protruding direction of these terminal connection parts 32 will be called upward and its opposite direction will be called downward.

Figure 10:
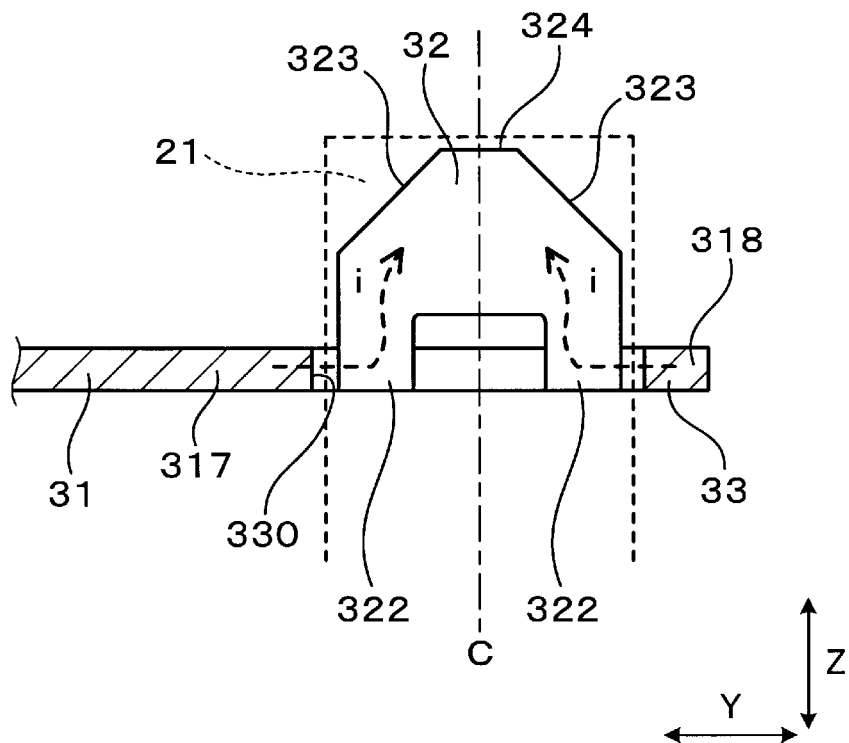
FIG. 10 is an explanatory diagram illustrating electric current paths in the terminal connection part as viewed from an X direction, in the first embodiment.

As shown in FIG. 10, the terminal connection parts 32 have a line-symmetric shape with respect to a center line C along the thickness direction Z, as viewed from a normal direction X of the terminal arrangement surface 321. In the following description, the normal direction X of the terminal arrangement surface 321 will also be called simply X direction. In addition, a direction orthogonal to both the X direction and the Z direction will be called Y direction.

Each of the terminal connection parts 32 protrudes upward in the Z direction at leg parts 322 provided at two places in the Y direction so as to be continuous with the rising bent part 34. The two leg parts 322 are coupled to each other at the upper side to constitute one terminal connection part 32. The upper end portion of the terminal connection part 32 is formed in a substantially trapezoidal shape, has inclined edges 323 on both sides in the Y direction, and has a leading edge 324 between the two inclined edges 323.

As shown in FIG. 1, the power conversion apparatus 1 has a plurality of semiconductor modules 2 aligned in the X direction. Each of the semiconductor modules 2 has a module body part 20 with a built-in switching element and a plurality of power terminals 21 that protrude from the module body part 20. As shown in FIGS. 1 and 2, the protruding direction of the plurality of power terminals 21 is upward in the Z direction. The power terminals 21 each have a plate shape with their thickness direction oriented in the X direction.

The power terminals 21 are connected to the corresponding terminal connection parts 32 of the bus bars 3 so as to overlap the terminal connection parts 32 in the X direction. The power terminals 21 and the terminal connection parts 32 are welded at the leading edges 324 of the terminal connection parts 32.

The power conversion apparatus 1 has a capacitor 4 that is electrically connected to the plurality of semiconductor modules 2. The capacitor 4 serves as a smoothing capacitor that smooths out a direct-current voltage input to the semiconductor modules 2. The bus bars 3 connect the capacitor 4 and the plurality of semiconductor modules 2. The pair of bus bars 3 includes a positive bus bar 3P and a negative bus bar 3N. The positive bus bar 3P is the bus bar 3 that connects the capacitor 4 and the positive power terminals 21 of the plurality of semiconductor modules 2. The negative bus bar 3N is the bus bar 3 that connects the capacitor 4 and the negative power terminals 21 of the plurality of semiconductor modules 2.

Figure 3:
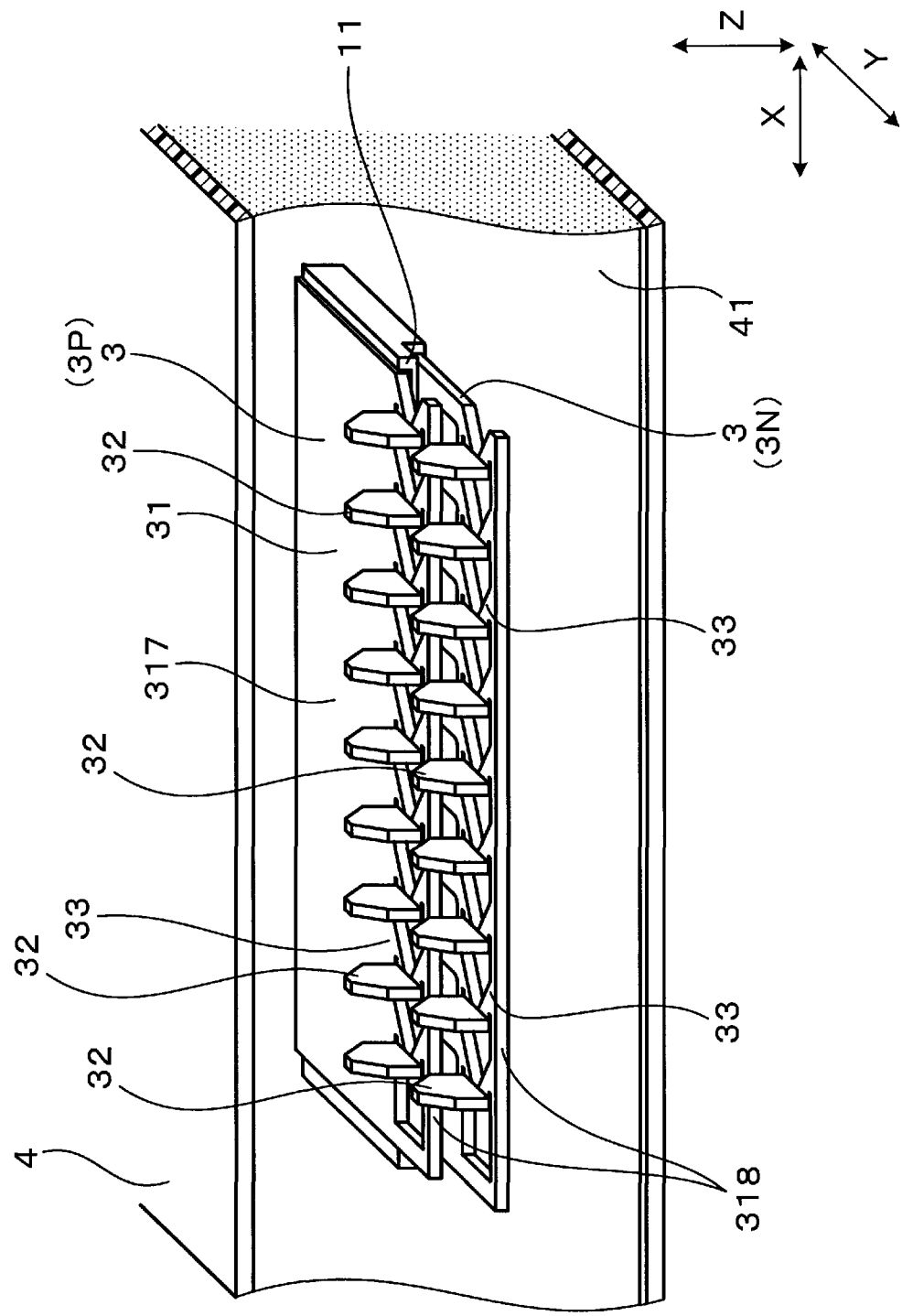
FIG. 3 is a perspective view of a capacitor and a pair of bus bars in the first embodiment.

The pair of bus bars 3 has first ends connected to a pair of electrodes in the capacitor 4. That is, the positive bus bar 3P and the negative bus bar 3N are connected to the pair of electrodes of a capacitor element (not shown) provided in the capacitor 4. As shown in FIG. 3, the pair of bus bars 3 protrudes in the Y direction from a potting surface 41 of the capacitor 4 while they overlap each other in the thickness direction Z.

As shown in FIGS. 3 to 6, the body plate parts 31 of the bus bars 3 are formed in a plate shape and partially overlap each other in the Z direction. An insulating plate 11 is interposed between the body plate parts 31 of the pair of bus bars 3 for electric insulation. The insulating plate 11 is formed from a resin molded material or the like, for example. The positive bus bar 3P is arranged on the upper side of the insulating plate 11, and the negative bus bar 3N is arranged on the lower side of the insulating plate 11.

The bus bars 3 have pluralities of terminal connection parts 32 near edges of the body plate parts 31 on the side distant from the capacitor 4 in the Y direction. The positions of the two bus bars 3 are different from each other at the edges (hereinafter, called plate edges 319) on the side distant from the capacitor 4 in the Y direction. In the present embodiment, the negative bus bar 3N extends farther than the positive bus bar 3P to the side distant from the capacitor 4.

Figure 5:
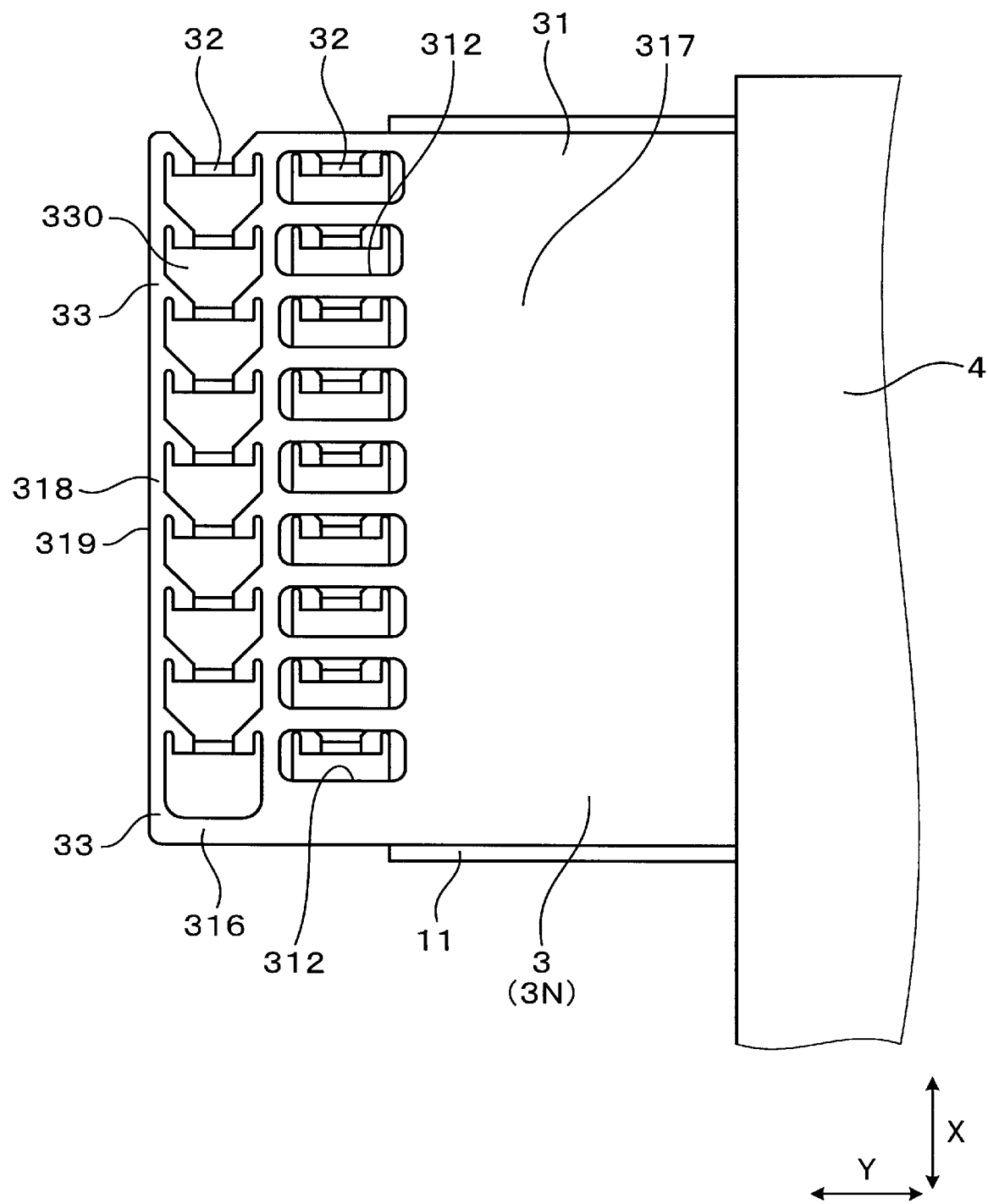
FIG. 5 is a bottom plan view of the capacitor and the pair of bus bars in the first embodiment.

The negative bus bar 3N has the plurality of terminal connection parts 32 at positions on the side distant from the capacitor 4 in the Y direction beyond the plate edges 319 of the positive bus bar 3P. On the other hand, the positive bus bar 3P has the plurality of terminal connection parts 32 formed at the place overlapping the negative bus bar 3N. Accordingly, as shown in FIGS. 5, 6, and 8, the body plate part 31 of the negative bus bar 3N has through holes 312 that penetrate therethrough in the Z direction near the place overlapping the terminal connection parts 32 of the positive bus bar 3P. The positive power terminals 21 of the semiconductor modules 2 are arranged so as to pass through the through holes 312 (see FIG. 10).

Figure 4:
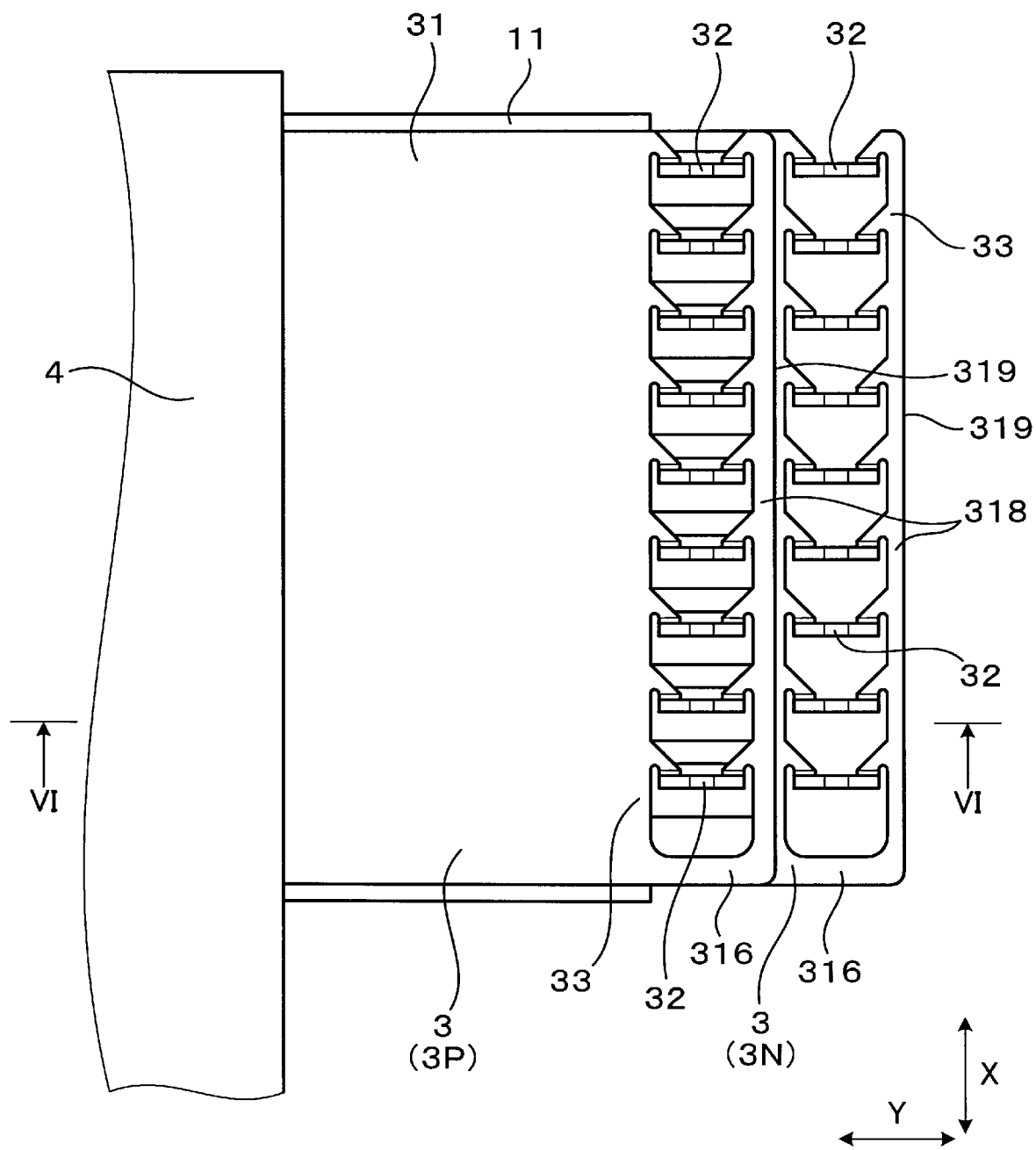
FIG. 4 is a top plan view of the capacitor and the pair of bus bars in the first embodiment.

As shown in FIGS. 4 and 5, the plurality of terminal connection parts 32 in each of the bus bars 3 are linearly arranged in the X direction. The plurality of terminal connection parts 32 are coupled to each other on the both sides in the Y direction. That is, the body plate part 31 is formed on both sides of the plurality of terminal connection parts 32 in the Y direction. In other words, the body plate part 31 has a large-area part 317 arranged nearer the capacitor 4 than the terminal connection part 32 and a coupling part 318 arranged nearer the plate edge 319.

The large-area part 317 is a part with a relatively wide area that is formed in a plate shape and has an overlapping portion of the pair of bus bars 3. The coupling part 318 is a part formed continuously along the plate edge 319 in the X direction and couples the plurality of terminal connection parts 32 arranged in the X direction. The terminal connection part 32 is formed between the large-area part 317 and the coupling part 318 and is connected to these two parts. Thus, the plurality of annular parts 33 is formed in each of the bus bars 3 as shown in FIGS. 7 and 8.

That is, each of the annular parts 33 is an annularly continuous part formed by the two terminal connection parts 32 adjacent to each other in the X direction, a portion of the large-area part 317, and a portion of the coupling part 318. Each of the annular parts 33 arranged at one end in the X direction has one terminal connection part 32, a portion of the large-area part 317, and a portion of the coupling part 318. This annular part 33 is annularly shaped by including a parallel part 316 that is arranged parallel to the terminal connection part 32 in the X direction and formed between the large-area part 317 and the coupling part 318.

The annular parts 33 inwardly constitute openings 330 that penetrate therethrough in the Z direction. The power terminals 21 are arranged so as to pass through the openings 330. In particular, the positive power terminals 21 are arranged so as to pass through both the through holes 312 of the negative bus bars 3N and the openings 330 of the positive bus bar 3P in the Z direction.

Next, advantageous effects of the present embodiment will be described.

In the power conversion apparatus 1 described above, at least one of the pair of bus bars 3 has the plurality of annular parts 33 that are annularly formed so as to include the plurality of terminal connection parts 32. This increases electric current paths around the terminal connection parts 32 and reduces the inductance of the bus bars 3.

Figure 11:
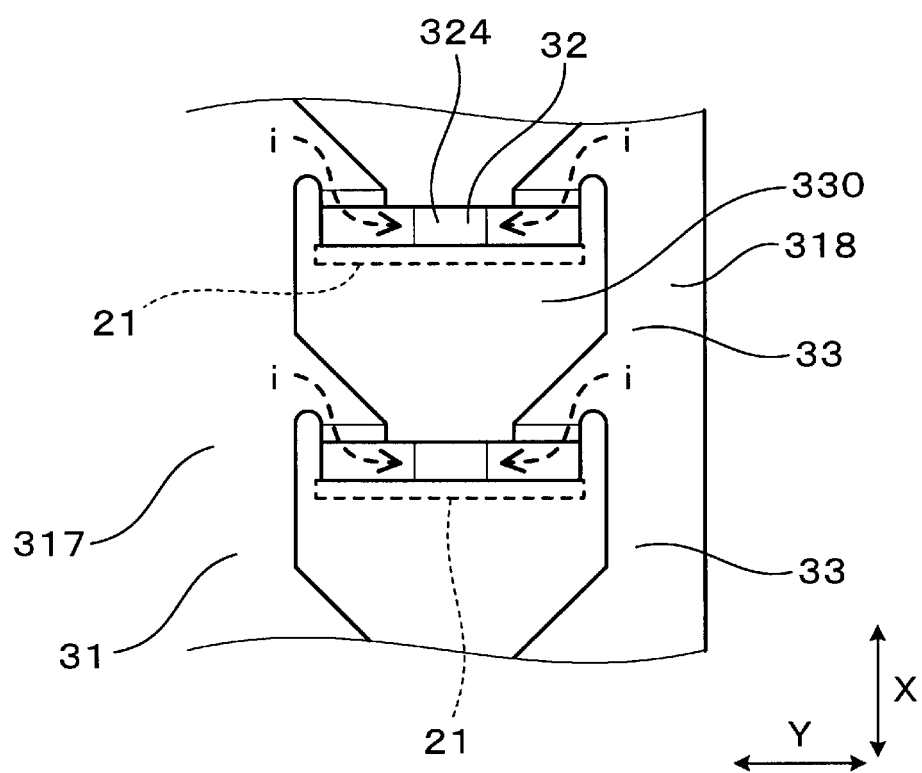
FIG. 11 is an explanatory diagram illustrating electric current paths in the terminal connection part as viewed from a Z direction, in the first embodiment.

That is, as shown in FIGS. 10 and 11, forming the annular parts 33 so as to include the terminal connection parts 32 allows an electric current i to flow into the terminal connection parts 32 from both sides. Specifically, it is possible to secure two paths of the electric current i flowing into each of the terminal connection parts 32, that is, the electric current path from the large-area part 317 to the terminal connection parts 32 and the current path from the coupling part 318 to the terminal connection parts 32. This achieves reduction of the inductance. That is, the number of the electric current paths are increased, thereby to reduce the inductance of the bus bars.

Each of the terminal connection part 32 is connected to the large-area part 317 and the coupling part 318 on both sides in the Y direction so that it is easy to disperse and release the heat of welding to the both sides in the Y direction. The paths of the heat are in the directions opposite to arrows i shown in FIGS. 10 and 11.

Providing the coupling parts 318 allows the terminal connection parts 32 to have a double-sided beam structure, thereby improving the rigidity of the bus bars 3.

The bus bars 3 have the pluralities of annular parts 33, which allows the power terminals 21 to be inserted into the openings 330 inside the annular parts 33. This facilitates positioning of the terminal connection parts 32 and the power terminals 21 at the time of assembling the bus bars 3 and the semiconductor modules 2. As a result, the productivity of the power conversion apparatus 1 can be improved.

The negative bus bar 3N has the plurality of through holes 312. This allows both the positive power terminals 21 and the negative power terminals 21 to be easily connected to the bus bars 3 while the pair of bus bars 3 overlaps in a wide area in the Z direction.

Each of the pair of bus bars 3 has the plurality of annular parts 33. This reduces the inductance in the pair of bus bars 3 and further decreases switching loss.

The terminal connection parts 32 protrude in the thickness direction Z with respect to the body plate parts 31. This allows easy and reliable connection between the power terminals 21 protruding in the Z direction and the terminal connection parts 32.

The terminal connection parts 32 each have the curved part 341 on the outer surface of the rising bent part 34. The leading ends of the power terminals 21 and the leading ends of the terminal connection parts 32 are oriented in the same direction, that is, upward in the Z direction. Accordingly, when any of the power terminals 21 is brought close to the corresponding terminal connection part 32 from the lower side to cause the terminal connection part 32 and the power terminal 21 to overlap each other, the curved part 341 can serve as a guide surface. Therefore, the semiconductor modules 2 and the bus bars 3 can be assembled together more smoothly.

The terminal connection parts 32 each have a line-symmetry shape with respect to the center line C as viewed from the X direction. This makes it possible to evenly radiate the heat from the terminal connection parts 32 to the both sides in the Y direction. That is, when any of the terminal connection parts 32 is welded with the corresponding power terminal 21 at the leading edge 324, the heat of the welding is easy to evenly release to the both sides in the Y direction. As a result, efficient heat radiation is enabled so that the thermal load on the semiconductor modules 2 can be suppressed in a more effective manner.

As described above, according to the present embodiment, it is possible to provide a power conversion apparatus that is capable of reducing the inductance.

Second Embodiment

Figure 12:
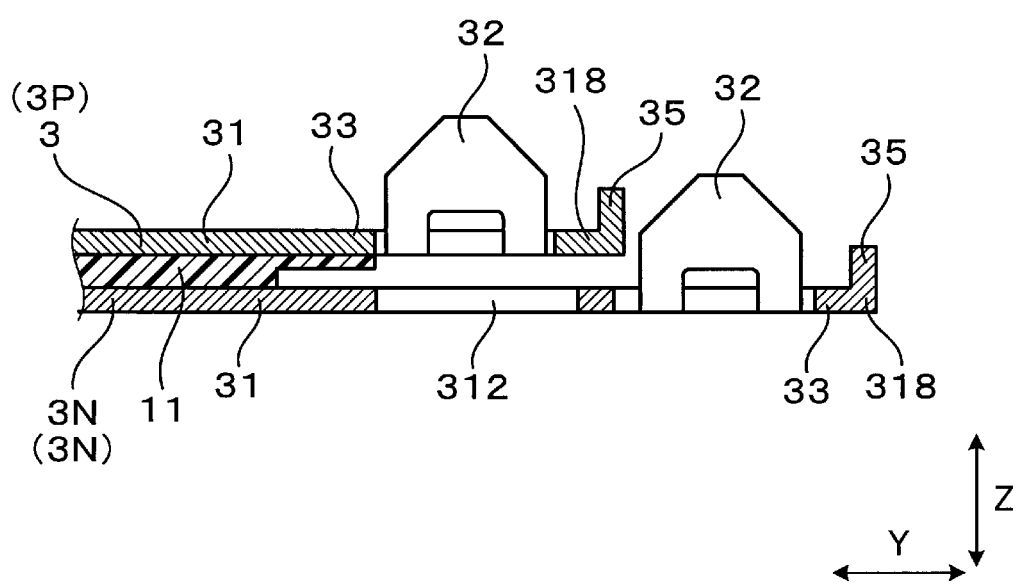
FIG. 12 is a cross-sectional view of a pair of bus bars in a second embodiment.
Figure 13:
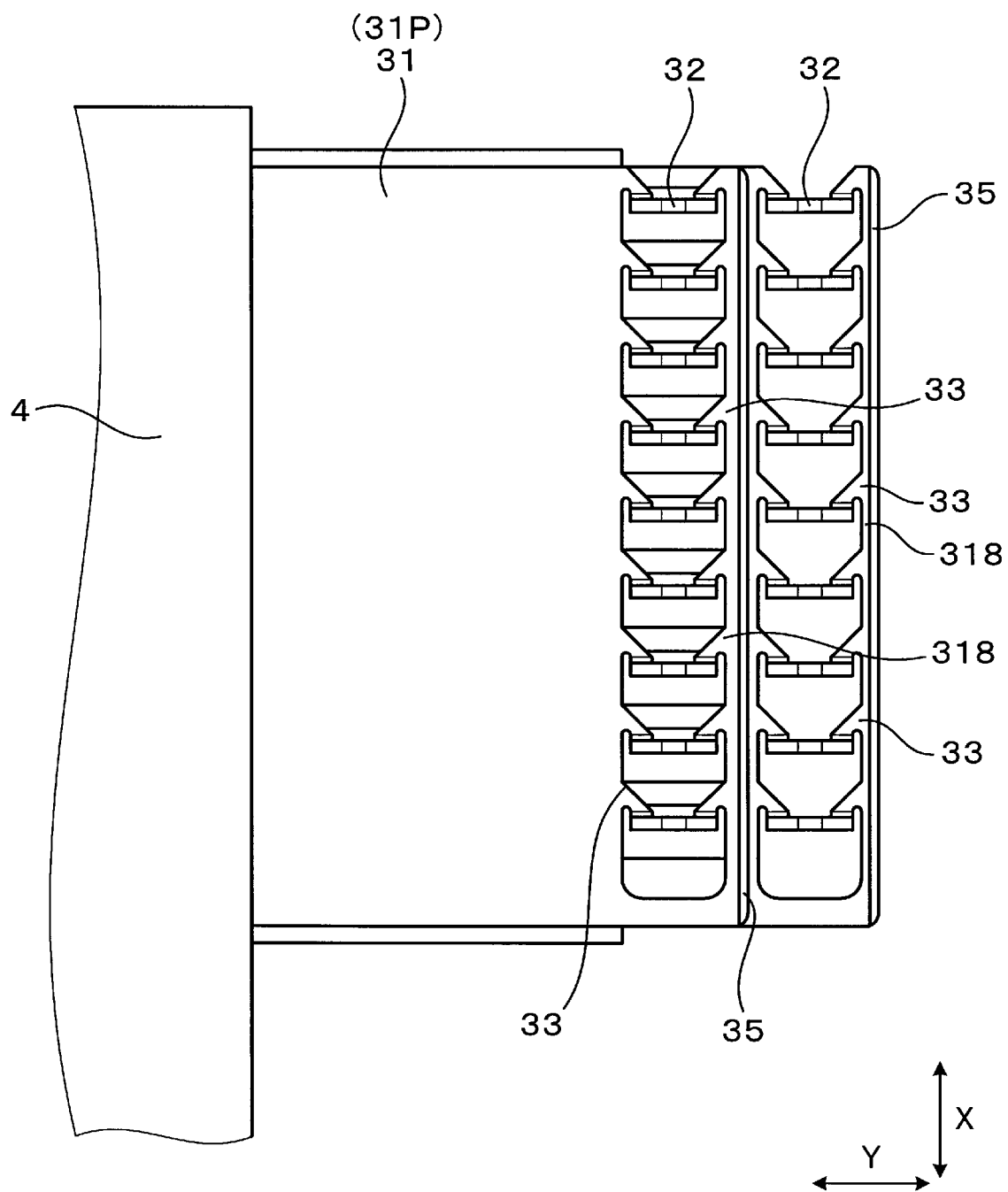
FIG. 13 is a plan view of a capacitor and the pair of bus bars in the second embodiment.

The present embodiment is an embodiment of a power conversion apparatus 1 in which bus bars 3 have edge bent parts 35 as shown in FIGS. 12 and 13.

Pluralities of annular parts 33 are linearly arranged in a direction orthogonal to a thickness direction Z. In the present embodiment, the pluralities of annular parts 33 are linearly arranged in an X direction. The bus bars 3 have the edge bent parts 35 that are bent in the thickness direction Z at edges along the arrangement direction of the pluralities of annular parts 33, that is, along the X direction.

That is, the edge bent parts 35 are formed at edges of coupling parts 318 on the side distant from the terminal connection parts 32. The edge bent parts 35 are formed continuously in the X direction.

The edge bent parts 35 protrude upward from body plate parts 31 of the bus bars 3 in the Z direction.

Other components of the second embodiment are similar to those of the first embodiment. Out of reference signs used in the second and subsequent embodiments, the same reference signs as those used in the embodiment already described above denote constituent elements that are similar to those of the embodiment already described above unless otherwise specified.

In the present embodiment, it is possible to improve the rigidity of the coupling parts 318 and further improve the rigidity of the bus bars 3. This increases the reliability of connection between the bus bars 3 and the power terminals 21.

In other respects, the second embodiment has advantageous effects that are similar to those of the first embodiment.

Third Embodiment

Figure 14:
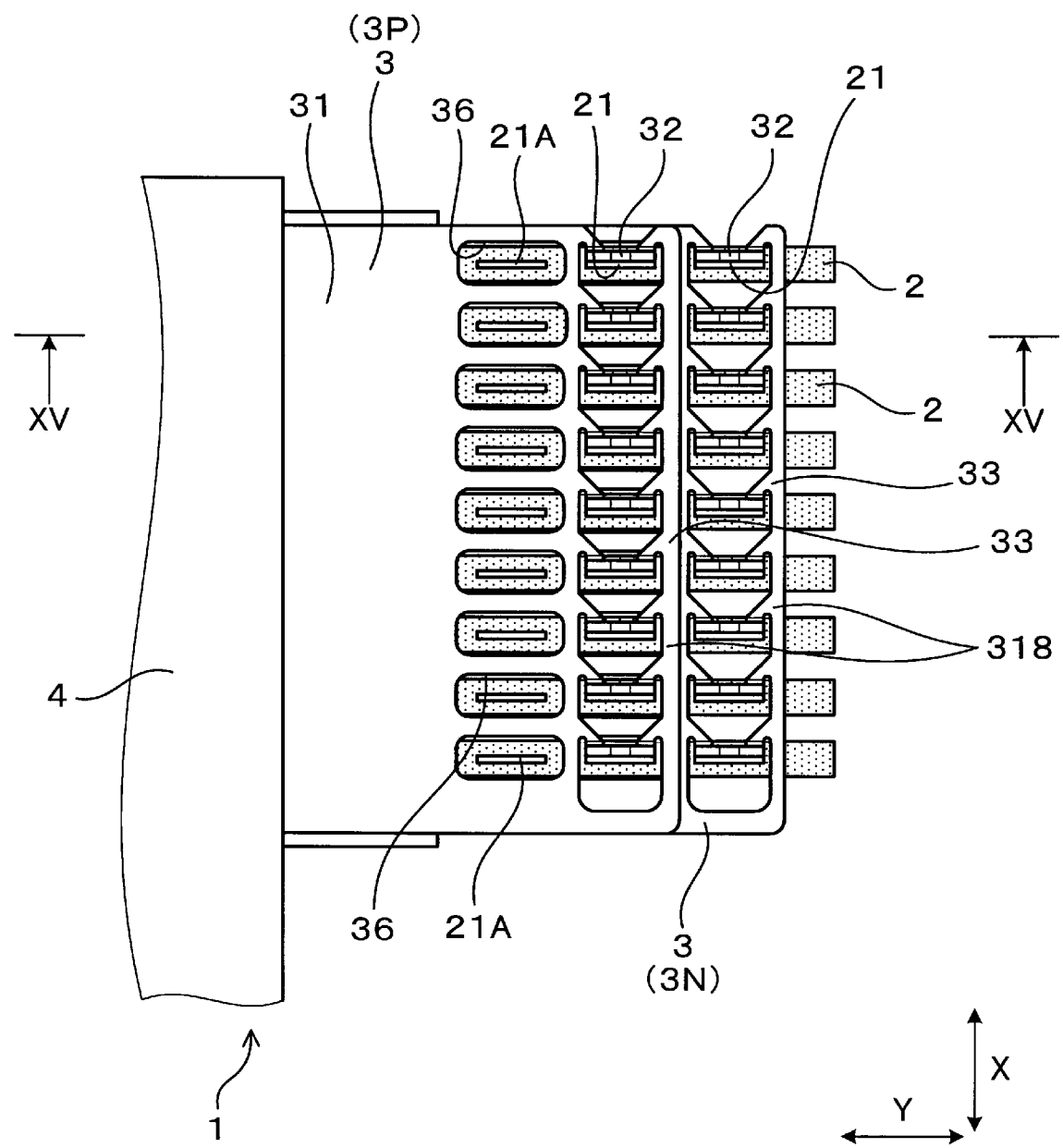
FIG. 14 is an explanatory plan view of a power conversion apparatus in a third embodiment.
Figure 15:
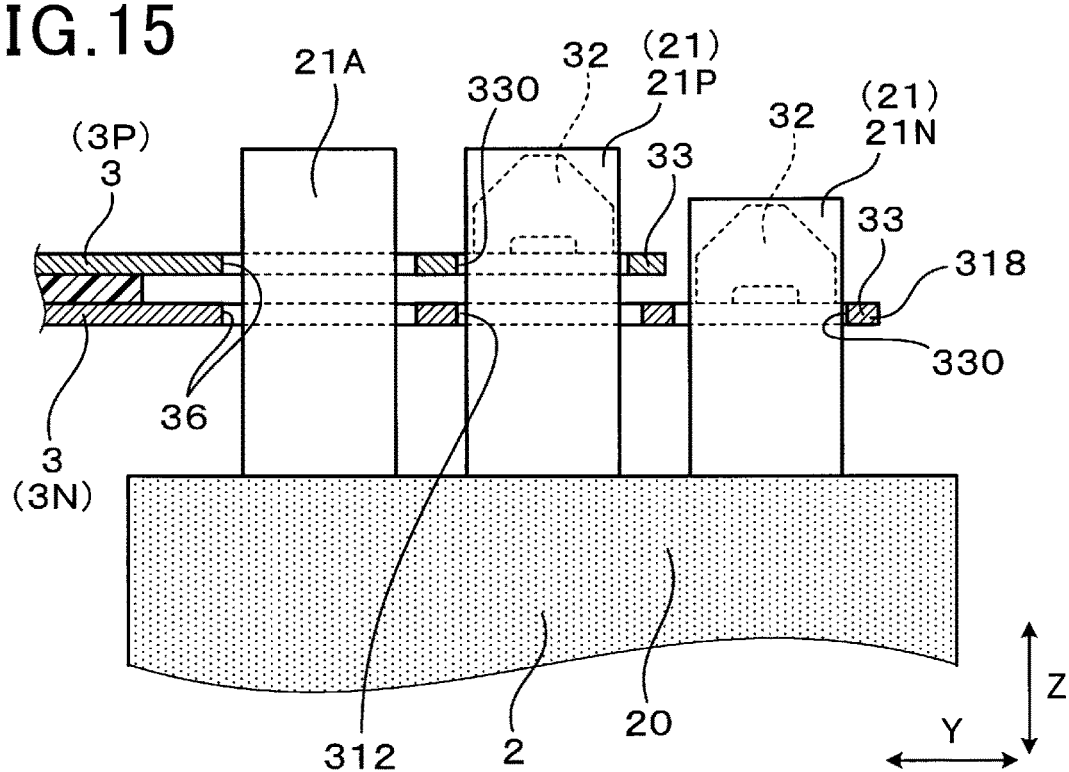
FIG. 15 is a cross-sectional view of connections between terminal connection parts and power terminals, taken along line XV-XV in FIG. 14.

The present embodiment is an embodiment in which bus bars 3 is provided with through window parts 36 into which output terminals 21A of semiconductor modules 2 are inserted as shown in FIGS. 14 and 15.

That is, the semiconductor modules 2 each have an output terminal 21A that outputs alternating-current power in addition to power terminals 21P and 21N to which direct-current power is input. In the present embodiment, the output terminal 21A protrudes in the same direction as the power terminals 21P and 21N, that is, upward in a Z direction. Further, the output terminal 21A is arranged closer to a capacitor 4 than the power terminals 21P and 21N. This is because the bus bars 3 have the through-window parts 36 so that the output terminals 21A do not interfere with the bus bars 3.

As shown in FIG. 15, the plurality of through-window parts 36 are formed in both of the pair of bus bars 3. The pair of bus bars 3 is arranged such that the through-window parts 36 overlap each other in the Z direction. The output terminals 21A are arranged through the through-window parts 36 arranged so as to overlap each other in the Z direction. There are provided air gaps between the output terminals 21A and inner peripheral edges of the through-window parts 36 so that the output terminals 21A and the bus bars 3 are electrically insulated from each other.

The output terminals 21A are connected to an output bus bar (not shown) above the two bus bars 3 in the Z direction. The output bus bar is electrically connected to an alternating-current load such as a rotary electric machine.

Other components of the third embodiment are similar to those of the first embodiment.

In the present embodiment, it is possible to effectively prevent interference between the output terminals 21A and the bus bars 3. Since the output terminals 21A can be arranged closer to the capacitor 4, it is possible to achieve space saving and facilitate size reduction of the power conversion apparatus 1.

In other respects, the third embodiment has advantageous effects that are similar to those of the first embodiment.

Fourth Embodiment

Figure 16:
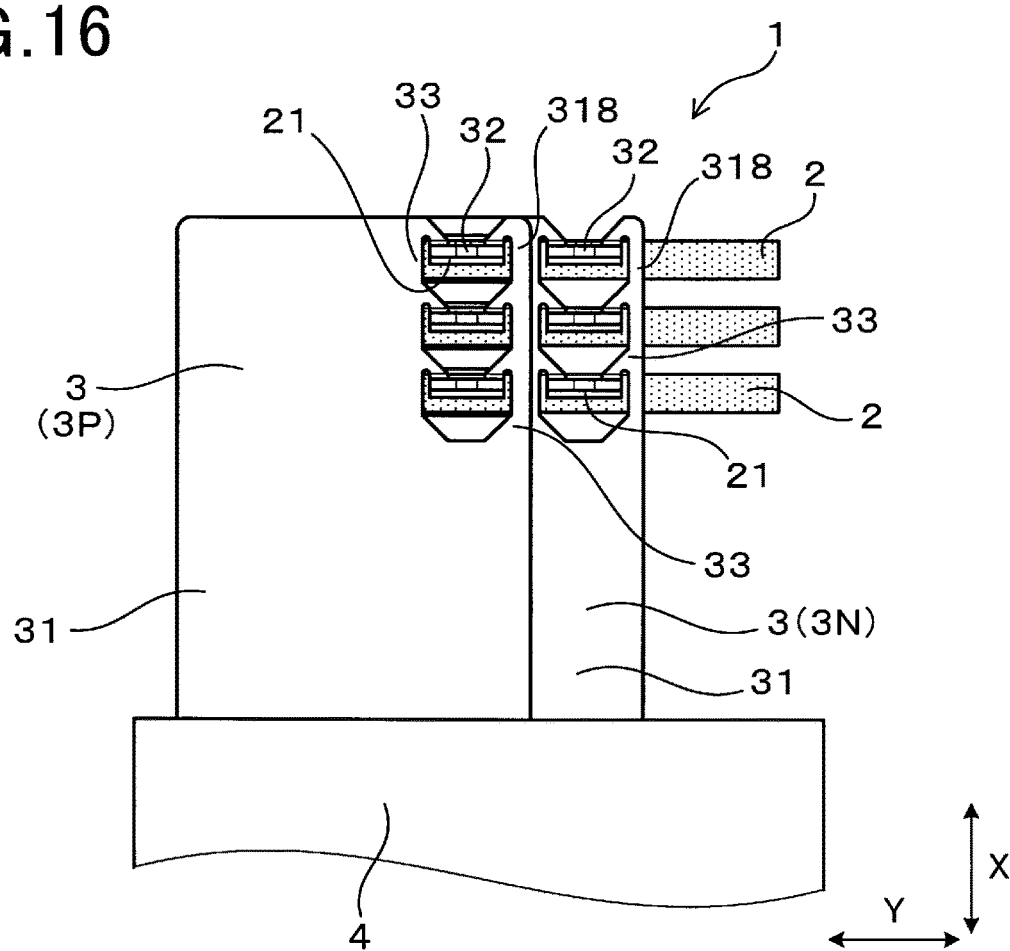
FIG. 16 is an explanatory plan view of a power conversion apparatus in a fourth embodiment.

The present embodiment is an embodiment different from the first embodiment in the relative positions of a capacitor 4 and bus bars 3 as shown in FIG. 16.

Specifically, the bus bars 3 are arranged adjacent to the capacitor 4 in an X direction. That is, the bus bars 3 protrude from the capacitor 4 in the X direction.

The pair of bus bar 3 is arranged such that body plate parts 31 partially overlap each other in a Z direction. In addition, the pair of bus bars 3 is arranged such that the body plate part 31 of the negative bus bar 3N partially protrudes farther than the positive bus bar 3P to one side in the Y direction. The negative bus bar 3N has a plurality of terminal connection parts 32 provided at places not overlapping the positive bus bar 3P in the Z direction.

The stacking direction of a plurality of semiconductor modules 2 is the X direction, and the main surfaces of the semiconductor modules 2 and the capacitor 4 face each other in the X direction. However, another part may be arranged between the main surfaces of the semiconductor modules 2 and the capacitor 4.

Other components of the fourth embodiment are similar to those of the first embodiment.

The present embodiment can produce advantageous effects similar to those of the first embodiment.

Besides the above-described embodiments, embodiments modified in various manners from the above-described embodiments can be employed.

For example, the polarities of a pair of bus bars 3 and power terminals 21 can be inverted. That is, the positive bus bar 3P and the negative bus bar 3N may be exchanged such that the relative positions and shapes of the two are inverted.

In addition, a plurality of annular parts may be provided in only one of the pair of bus bars.

The present disclosure is not limited to the above-described embodiments but can be applied to various embodiments without deviating from the gist of the present disclosure.

The present disclosure has been described so far according to the embodiments, but it is noted that the present disclosure is not limited to the foregoing embodiments or structures. The present disclosure also includes various modifications and changes in a range of equivalency. In addition, various combinations and modes, and other combinations and modes including only one element of the foregoing combinations and modes, less or more than the one element are included in the scope and conceptual range of the present disclosure.

What is claimed is:

1. A power conversion apparatus comprising:
   a semiconductor module comprising a built-in switching element; and
   two bus bars connected to respective power terminals of the semiconductor module, wherein
   the bus bars have (i) body plate parts, which are arranged so as to at least partially face each other in a thickness direction of the body plate parts, and (ii) pluralities of terminal connection parts that are branched from the body plate parts and to which the power terminals are connected,
   one of the bus bars has a plurality of annular parts that are annularly formed so as to include the plurality of terminal connection parts of the one bus bar,
   the plurality of annular parts are linearly arranged in a direction orthogonal to the thickness direction, and
   the one bus bar has an edge bent part that is bent in the thickness direction at an edge of the one bus bar that extends along an arrangement direction of the plurality of annular parts.

2. The power conversion apparatus according to claim 1, wherein each of the bus bars has the plurality of annular parts.

3. The power conversion apparatus according to claim 1, wherein the terminal connection parts protrude in the thickness direction of the body plate parts.

4. The power conversion apparatus according to claim 3, wherein
   each of the terminal connection parts has a curved part, which connects (i) a main surface of the corresponding body plate part and (ii) a terminal arrangement surface of the terminal connection part, on an outer surface of a rising bent part between the terminal connection part and the corresponding body plate part, and for each of the terminal connection parts, a leading end of the corresponding power terminal and a leading end of the terminal connection part are oriented in the same direction.

5. The power conversion apparatus according to claim 4, wherein the terminal connection parts each have a line-symmetric shape with respect to a center line along the thickness direction, as viewed from a normal direction of the terminal arrangement surface.

6. The power conversion apparatus according to claim 1, wherein the edge bent part extends continuously in the arrangement direction from one end of the one bus bar to an opposite end of the one bus bar.

7. The power conversion apparatus according to claim 1, wherein the edge bent part extends continuously in the arrangement direction beyond the plurality of annular parts of the one bus bar.

8. The power conversion apparatus according to claim 1, wherein the edge bent part of the one bus bar is located outside the plurality of annular parts when viewed along the thickness direction, and the edge at which the edge bent part is bent is an exterior edge of the one bus bar.

\* \* \* \* \*